(12) United States Patent
Kirschenbaum

(10) Patent No.: US 6,995,318 B2
(45) Date of Patent: Feb. 7, 2006

(54) METHOD FOR TESTING INTEGRITY OF ELECTRICAL CONNECTION OF A FLAT CABLE MULTIPLE CONNECTOR ASSEMBLY

(75) Inventor: Leif Stefan Kirschenbaum, San Francisco, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/662,111

(22) Filed: Sep. 12, 2003

(65) Prior Publication Data

US 2005/0057262 A1    Mar. 17, 2005

(51) Int. Cl.
*H01B 7/08*    (2006.01)

(52) U.S. Cl. .................................. 174/117 F
(58) Field of Classification Search ............ 174/117 F, 174/117 FF, 88 R, 94 R
See application file for complete search history.

(56) References Cited

U.S. PATENT DOCUMENTS

| | | | |
|---|---|---|---|
| 3,275,968 A | 9/1966 | McCaughey | |
| 4,526,432 A | 7/1985 | Cronin et al. ............ 339/75 M |
| 5,102,346 A | 4/1992 | Soes ........................... 439/268 |
| 5,384,432 A * | 1/1995 | Noro et al. ............. 174/117 FF |
| 5,691,509 A * | 11/1997 | Balzano ................... 174/117 F |
| 6,020,559 A * | 2/2000 | Maeda .................... 174/117 F |
| 6,099,356 A | 8/2000 | Hwang ....................... 439/660 |
| 6,165,008 A | 12/2000 | Wu et al. .................... 439/492 |
| 6,301,247 B1 | 10/2001 | Larson et al. ............... 370/387 |
| 6,305,968 B1 | 10/2001 | Hio et al. .................... 439/422 |
| 6,371,797 B1 | 4/2002 | Kikuchi et al. ............. 439/496 |

* cited by examiner

*Primary Examiner*—Chau N. Nguyen
(74) *Attorney, Agent, or Firm*—Zilka-Kotab, PC

(57) ABSTRACT

A method for testing an electrical connection to a flat electrical cable. The cable includes a flexible sheath having first and second ends and multiple conductors embedded in the sheath. For each conductor, first and second electrical contacts are in communication with the conductor. Also for each conductor, a third electrical contact is in communication with the conductor. The third electrical contact is amenable to coupling with an electronic component. The method includes creating a first electrical coupling between a conductor of a flat cable and a test system, and an electronic component is electrically coupled to the flat cable. A second electrical coupling is created between the conductor and the test system, the second electrical coupling also being positioned towards the first end of the flat cable. An electrical charge is introduced from the test system to the first electrical coupling. A resistance across some or all of the first and second electrical couplings is determined.

10 Claims, 4 Drawing Sheets

METHOD FOR TESTING INTEGRITY OF ELECTRICAL CONNECTION OF A FLAT CABLE MULTIPLE CONNECTOR ASSEMBLY

FIELD OF THE INVENTION

The present invention relates to flat cable connections, and more particularly, this invention relates to flat cables with multiple connections per single wire and methods for testing the integrity of electrical connections to such cables.

BACKGROUND OF THE INVENTION

Flexible flat cables have gained widespread acceptance and are gaining prevalence over conventional round wire systems because of their compact design, low cost, and ability to bend. Flexible flat cables, for example, are used for electrical connection to components in many consumer electronic applications, such as digital and analog tape heads, inkjet and dot matrix printer heads, mobile phones, the connection between the body of a laptop computer and its lid, and other consumer electronics requiring small and lightweight flexible cables.

In a typical configuration of a flat cable, wires are embedded in a flexible plastic film. One end of the flat cable is connected to a component such as a tape head, print head, etc. typically via ultrasonic bonding or soldering. The other end of the flat cable typically has a contact pad or connector coupled to each wire. The contact pads or connector are later connected to a circuit board which sends signals through the wires to the component to control operation of the component. One type of connector for coupling the circuit board to the contact pads is a compression connector where cable pads are compressed onto a circuit board by a biased non-conductive (e.g., rubber) fitting. Another type of connector is an array of fingers with a conductor on one side which slide into a receptacle on the cable. A third is a connector which is permanently affixed to the cable end and which attaches to a circuit board.

After a flexible flat cable is affixed to a component it is desirable to ensure that all of the cable leads have proper electrical connection to that component. This is because if the manufacturer installs the component/cable combination in the end device and the component does not function, the product must be disassembled and another component/cable combination installed in the end device. To assure this connection, electrical measurements may be made on the unconnected end of the cable through two wires and some portion of the attached component in a particular circuit.

One problem encountered during testing flat cable connections is that when the cable is attached to the testing system, only a single contact is made to each wire in the cable. If the contacts on the cable are dirty (debris), corroded, misaligned, missing contact pad material, or the contacts on the test system are dirty or corroded, the test system will read a high resistance through some part of the component. In other words, a poor connection to the free end of the cable could inadvertently indicate a poor or nonexistent cable attachment to the component. If a bad connection is sensed between the cable and component, the component and cable are often discarded, as the cost of repairing a faulty connection is often more expensive than creation of a new unit. Thus, because it is impossible to tell whether the contact between the cable and the test system is bad, or whether the contact between the cable and the component is bad, the component may be needlessly discarded.

What is therefore needed is a way to avoid false indications of poor or nonexistent cable attachment to the component.

SUMMARY OF THE INVENTION

The present invention provides a solution for the aforementioned problems by providing an electrical cable and a method for testing an electrical connection to the electrical cable. The cable includes a flexible sheath having first and second ends and multiple conductors embedded in the sheath. For each conductor, first and second electrical contacts are in communication with the conductor, the first and second electrical contacts preferably being positioned towards the first end of the sheath. Also for each conductor, a third electrical contact is in communication with the conductor. The third electrical contact is amenable to coupling with an electronic component.

The first and second electrical contacts can be positioned on opposite sides of the sheath, and preferably are positioned directly opposite each other relative to the sheath to ensure good electrical coupling by biasing against the opposed pads. Such electrical contacts can be defined by pads positioned on the outside of the cable, apertures in the cable sheath providing access to the conductor, etc.

Alternatively, the first and second electrical contacts are positioned on a same side of the sheath. In such an embodiment, the first and second electrical contacts are preferably positioned within less than about 5 mm from each other.

In another embodiment, the electrical contacts can be located in a quick-connect type connector.

The electrical contacts of the cable can be adapted for contact by a biased, elongate, contact pin. The electrical contacts can also be adapted for contact by a biased contact member having a generally arcuate cross section. Other types of contact couplings may be used as well.

A method for testing an electrical connection to the cable, according to one embodiment, includes creating a first electrical coupling between a conductor of a flat cable and a test system, the first electrical coupling preferably being positioned towards a first end of the flat cable relative to the connection to the component. An electronic component is electrically coupled to the conductor in the cable, preferably towards a second end of the flat cable (relative to the first electrical coupling). As an optional step, an electrical charge can be introduced from the test system to the first electrical coupling for testing an electrical connection of the conductor to the component. A second electrical coupling is created between the conductor and the test system, the second electrical coupling preferably being positioned towards the first end of the flat cable. An electrical charge is introduced from the test system to an electrical coupling. A resistance across some or all of the first and second electrical couplings is determined. A high resistance (above a predetermined amount) across the first and second electrical couplings indicates a poor connection of the cable to the test system, and not necessarily a poor connection between the cable and the component. Note that couplings to be tested can be chosen based on a result of the testing of the electrical connection of the conductor to the component.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

BEST MODE FOR CARRYING OUT THE INVENTION

The following description is the best embodiment presently contemplated for carrying out the present invention. This description is made for the purpose of illustrating the general principles of the present invention and is not meant to limit the inventive concepts claimed herein.

Figure 1:
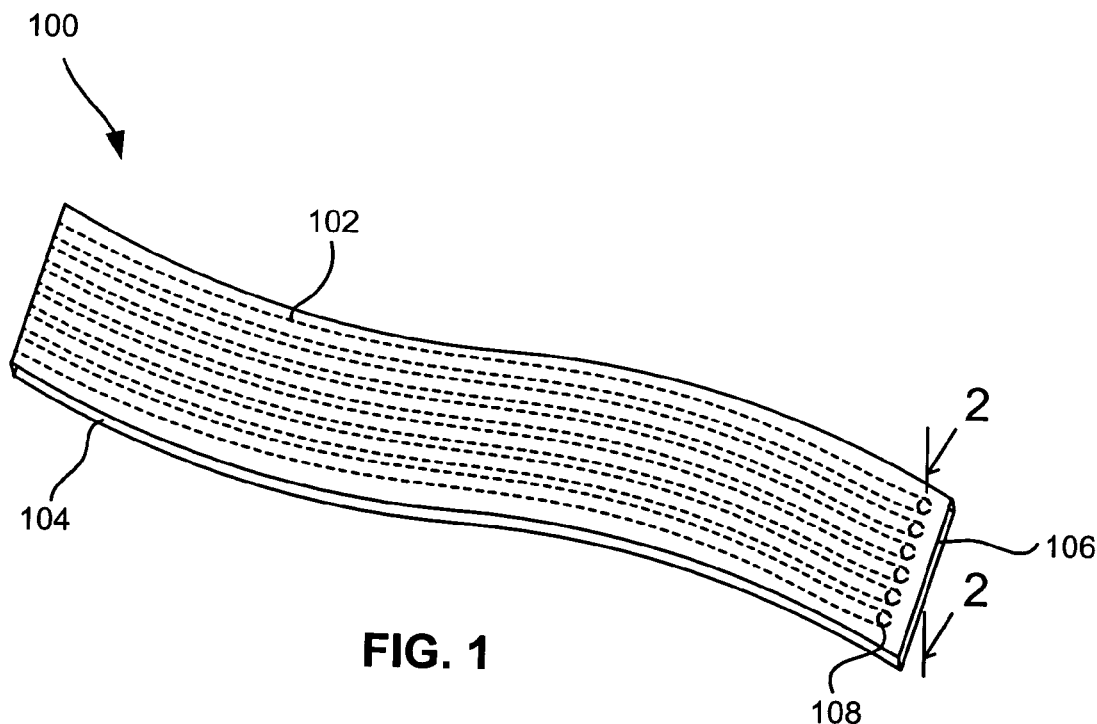
FIG. 1 is a perspective view of a flexible flat cable according to an embodiment of the present invention.
Figure 2:
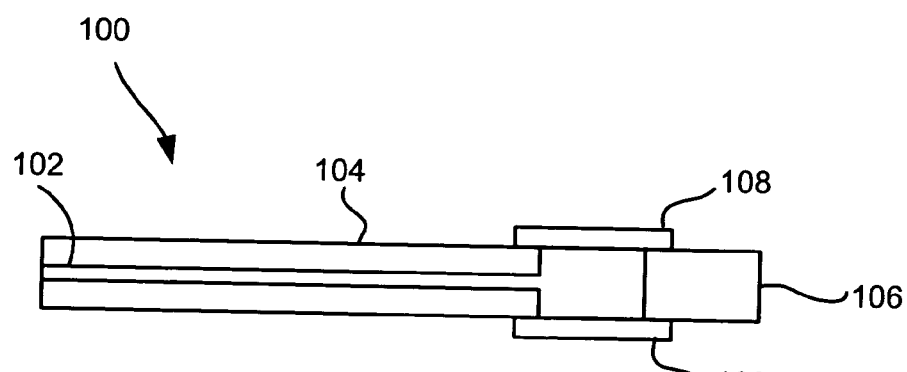
FIG. 2 is a cross sectional view of the flat cable of FIG. 1 taken along line 2—2 of FIG. 1.

FIGS. 1 and 2 illustrate a flexible flat cable 100 according to an embodiment of the present invention. As shown, the flat cable 100 includes multiple conductors 102 encased in a generally flat, thin, flexible, nonconductive sheath 104. The conductors 102 preferably comprise wires or the like made of an electrically conductive material such as copper, aluminum, etc. The sheath 104 can be formed from non-conductive plastic film, molded plastic, etc. A first end 106 of the flat cable 100 has multiple contacts coupled to each conductor 102. Preferably, the contacts are pads 108 coupled to, formed on, or formed from the conductors 102 by any suitable means. See, e.g., FIG. 4A. Ideally, the pads 108 are coated with a noble metal such as gold to prevent corrosion of pads 108. These pads 108 can then be connected to a circuit board, etc. Alternatively, the conductor 102 itself may be exposed through apertures in the sheath 104, thereby defining the contacts. See, e.g., FIG. 4B. The cable can also have another electrical contact (not shown), towards the second end of the cable or anywhere else on the cable, to which an electronic component can be attached. Also note that the contacts to/of the conductor can be positioned anywhere on the cable.

During creation of an electronic device, a second end of the flat cable 100 is coupled to a component such as a tape head, circuit card, print head, etc. such as by soldering. After the flat cable 100 is affixed to the component it is desirable to ensure that all of the cable leads have proper electrical connection to that component. To assure this connection, a single or many electrical measurements may be made on the unconnected end of the cable through two of the cable leads and through some portion of the attached component. For example, when testing a display, electricity is passed through the conductors 102 to determine if the corresponding transistors in the display function. As mentioned above, a problem with these measurements is that poor connection to the free (board) end of the cable will give a false indication of poor or nonexistent cable attachment to the component.

The present invention overcomes the problems of false indication of poor or nonexistent cable attachment to the component by creating two electrical couplings per conductor 102, resulting in four total contacts to measure integrity of the cable attachment to the component.

Figure 3:
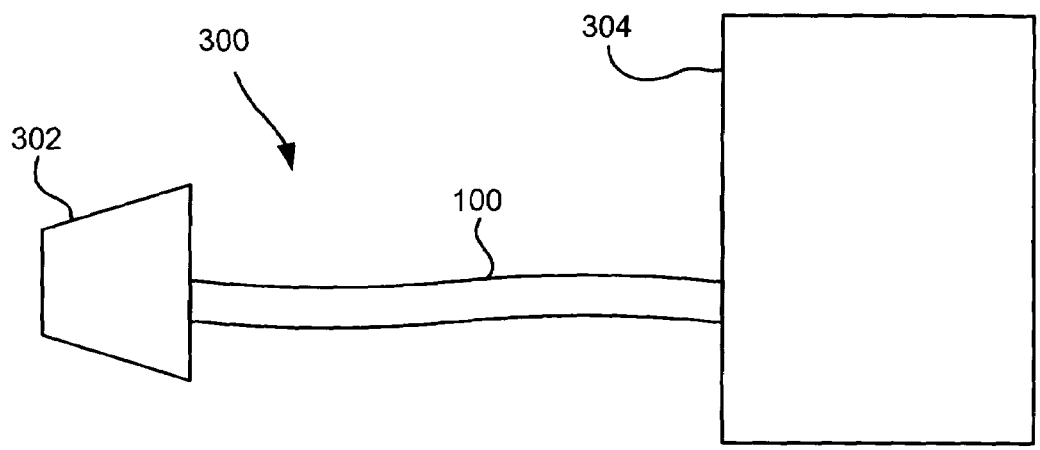
FIG. 3 illustrates a system for testing a flat cable according to one embodiment.

FIG. 3 illustrates a system 300 for testing a flat cable 100 according to one embodiment. As shown, a component 302 is attached to the flat cable 100. A test system 304 is detachably coupled to multiple contacts on each conductors 102 of the flat cable 100 towards the first end of the flat cable 100 via connectors such as those described below. For example, two electrical couplings are made to a single conductor 102 of the flexible flat cable 100. Then testing of the connection to the component 302 is performed to determine whether the device is properly connected to the cable. The dual or multiple electrical couplings on each selected conductor 102 virtually eliminates false negatives. In other words, errors previously caused by a single poor connection to the test system are avoided. The benefit of this testing is that once it is known that the cable connection to the component 302 is acceptable, the manufacturer can go to the expense of installing the part in the end product.

Additionally or alternatively, the electrical connections of the conductor 102 to the test system can be tested. For example, electricity is passed from one contact to the other across the same conductor 102, i.e., straight through or straight across the contacts of the conductor 102. If a low resistance is read across the conductor 102, the electrical couplings to the test system are good. If a high resistance (above a predetermined threshold) is sensed between the electrical couplings, the electrical contact at the test system is deemed bad. This indicates that the problem is probably not at the device end of cable 100, but rather at the test system end of cable 100. All couplings can be thus tested, or couplings can be chosen based on some criteria, such as based on a result of the testing of the electrical connection of the conductor to the component (e.g., perform test if a bad connection to the component is indicated), every other conductor, etc.

Figure 4A:
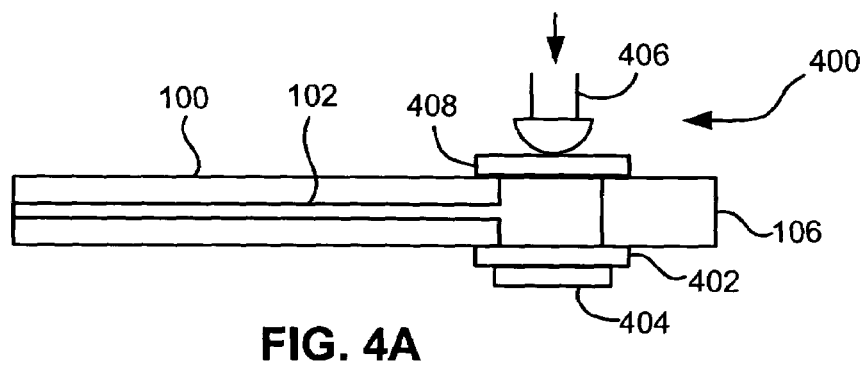
FIGS. 4A–B illustrate one type of connector for creating multiple electrical couplings between an electronic device and a single conductor of a flat cable.

FIG. 4A illustrates one type of connector 400 for creating multiple electrical couplings between a board, test system, etc. and a single conductor 102 positioned towards the first end of the flat cable 100. For simplicity, the following discussion shall refer to connection to a test system, it being understood that the cable can be connected to any other type of board or device, including an end user device. As shown in FIG. 4, a first pad 402 of the cable abuts a contact 404 of the test system. A biased contact pin 406 of the test system exerts pressure on a second pad 408 positioned on an opposite side of the cable 100. Note that the contacts of the cable are positioned directly opposite each other, but can also be offset from each other.

Figure 4B:
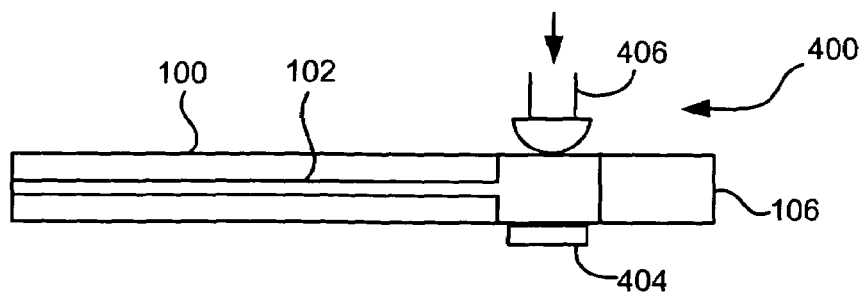

FIG. 4B depicts a variation of the cable and connector shown in FIG. 4A. Referring to FIG. 4B, the contact 404 and the contact pin 406 of the test system directly contact an exposed portion of the conductor 102 of the flat cable 100.

Figure 5A:
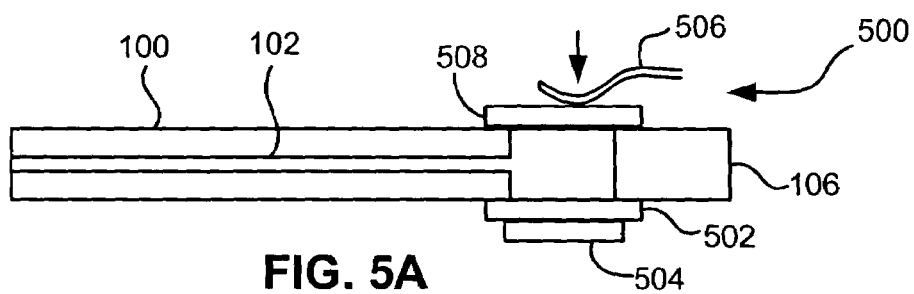
FIGS. 5A–B illustrate another type of connector for creating multiple electrical couplings between an electronic device and a single conductor of a flat cable.

FIG. 5A illustrates another type of connector 500 for creating multiple electrical couplings between a test system and a single conductor 102 towards the first end of the flat cable 100. This type of connector can be referred to as a zero-insertion force connector. As shown in FIG. 5, a first pad 502 of the cable abuts a contact 504 of the test system. A biased, curved contact element 506 of the test system exerts pressure on a second pad 508 positioned on an opposite side of the cable.

Figure 5B:
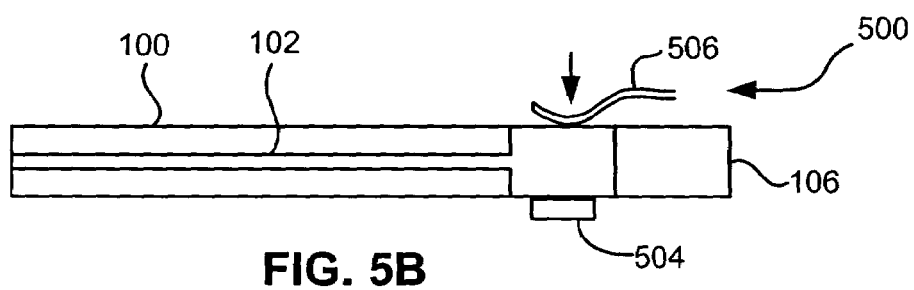

FIG. 5B depicts a variation of the cable and connector shown in FIG. 5A. Referring to FIG. 5B, the contact 504 and the contact element 506 of the test system directly contact an exposed portion of the conductor 102 of the flat cable 100.

Figure 6A:
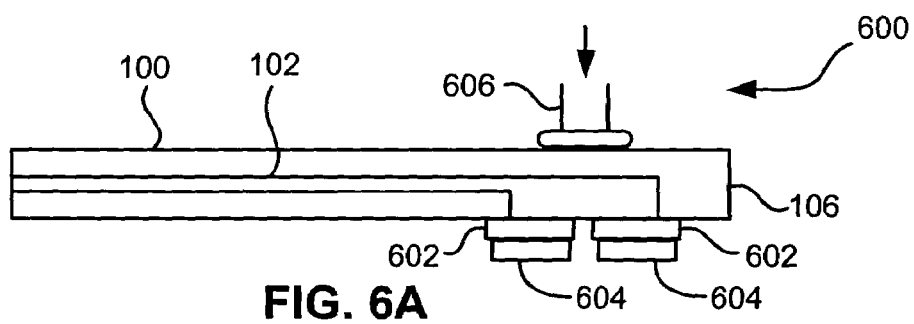
FIGS. 6A–C illustrate yet another type of connector for creating multiple electrical couplings between an electronic device and a single conductor of a flat cable.

FIG. 6A illustrates yet another type of connector 600 for creating multiple electrical couplings between a test system and a single conductor 102 towards the first end of the flat cable 100. As shown in FIG. 6A, pads 602 positioned on the same side of the cable abut contacts 604 of the test system. A biased compression element 606 of the test system exerts pressure on the opposite side of the cable. For example, the first and second electrical couplings are positioned within less than about 5 mm from each other, less than about 3 mm from each other, etc.

Figure 6B:
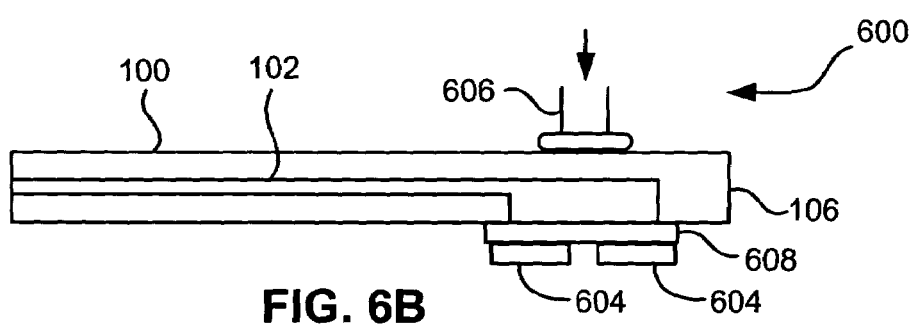

FIG. 6B depicts a variation of the cable and connector shown in FIG. 6A. Referring to FIG. 6B, the contacts 604 of the test system directly contact a long finger-like pad 608 coupled to the conductor 102 of the flat cable 100.

Figure 6C:
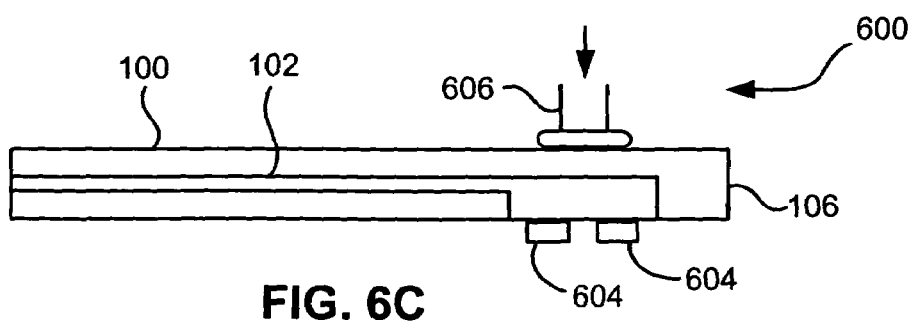

FIG. 6C depicts a variation of the cable and connector shown in FIG. 6A. Referring to FIG. 6C, the contacts 604 of the test system directly contact an exposed portion of the conductor 102 of the flat cable 100.

Figure 7A:
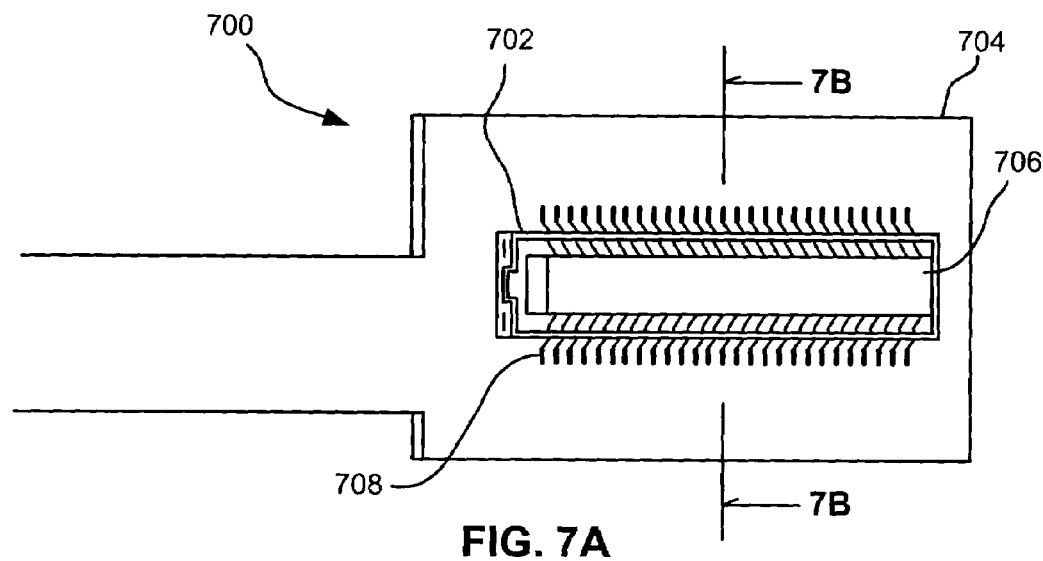
FIGS. 7A–C depict a cable having a connector permanently coupled to a non-component end thereof, according to various embodiments.

FIG. 7A illustrates a cable 700 having a quick-connect type connector 702 permanently coupled to a non-component (board) end 704 thereof. As shown, the connector 702 includes a pedestal 706 having multiple connection elements 708 extending therefrom and extending into the cable surface. The pedestal 706 is inserted into a receiver of a test system where contacts of the test system engage the connection elements 708. One skilled in the art will appreciate the general concept of the quick-connect connector, and thus the invention is not to be limited to the type of connector shown.

Figure 7B:
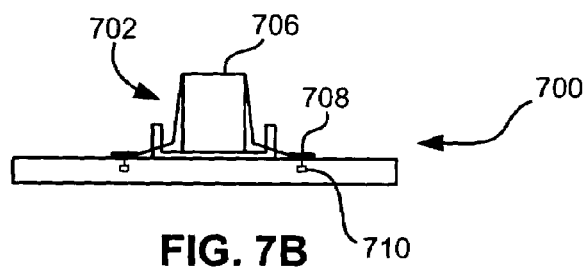

FIG. 7B depicts a cross sectional view of the cable 700 and connector 702 taken along line 7B of FIG. 7A.

Figure 7C:
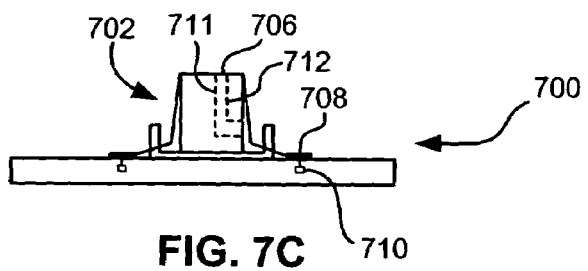

FIG. 7C is a variation of FIG. 7B illustrating coupling of two test system elements 711, 712 to a connection element 708 to a conductor 710 embedded in the cable. Because each connection element 708 has multiple electrical contacts, testing of the cable 700 can be performed substantially as described above.

Any of the connectors shown in FIGS. 4–7 can be implemented or "mixed and matched" with any of the cables 100 shown in FIGS. 4–7.

After testing, the cable/component combination can be installed in an end device. Note that in the final application in which the flat cable 100 is implemented, only one electrical coupling need be made between a particular conductor 102 and a board.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. An electrical cable, comprising:
   a flexible sheath having first and second ends;
   multiple conductors embedded in the sheath;
   for each conductor, first and second electrical contacts in communication with the conductor; and
   for each conductor, a third electrical contact in communication with the conductor;
   wherein the first and second electrical contacts are positioned on opposite sides of the sheath and positioned directly opposite each other relative to the sheath,
   wherein the first and second electrical contacts are positioned towards the first end of the sheath but do not extend beyond the first end of the sheath,
   wherein the third electrical contact is positioned towards the second end of the sheath.

2. The cable as recited in claim 1, wherein the first and second electrical contacts are portions of the conductors exposed through the sheath.

3. The cable as recited in claim 2, wherein the first and second electrical contacts are substantially coplanar with an outer surface of the sheath.

4. The cable as recited in claim 1, wherein the first and second electrical contacts for each conductor are aligned along a common plane.

5. The cable as recited in claim 1, wherein at least one of the first and second electrical contacts is adapted for contact by a biased, elongate, contact pin.

6. The cable as recited in claim 1, wherein at least one of the first and second electrical contacts is adapted for contact by a biased contact member having a generally arcuate cross section.

7. An electrical cable, comprising:
   a flexible sheath having first and second ends;
   multiple conductors embedded in the sheath;
   for each conductor, first and second electrical contacts in communication with the conductor; and
   for each conductor, a third electrical contact in communication with the conductor;
   wherein the first and second electrical contacts are positioned on opposite sides of the sheath,
   wherein the first and second electrical contacts are offset from each other,
   wherein the first and second electrical contacts are positioned towards the first end of the sheath but do not extend beyond the first end of the sheath,
   wherein the third electrical contact is positioned towards the second end of the sheath.

8. An electronic device, comprising:
   a cable comprising:
      a flexible sheath having first and second ends;
      multiple conductors embedded in the sheath;
      for each conductor, first and second electrical contacts in communication with the conductor;
      for each conductor, a third electrical contact in communication with the conductor;
      wherein the first and second electrical contacts are positioned on opposite sides of the sheath and positioned directly opposite each other relative to the sheath,
      wherein the first and second electrical contacts are positioned towards the first end of the sheath,
      wherein the third electrical contact is positioned towards the second end of the sheath; and
   a component coupled to the third electrical contacts.

9. The method as recited in claim 1, wherein the first and second electrical contacts are connection elements of quick connect type connectors.

10. The cable as recited in claim 9, wherein the first and second electrical contacts are adapted for compression coupling.

* * * * *